United States Patent [19]

Misono et al.

[11] Patent Number: 4,796,036
[45] Date of Patent: Jan. 3, 1989

[54] CAPSULE RUPTURE PRINTING SYSTEM

[75] Inventors: Shigemi Misono; Makoto Ueda; Kazuto Shikino; Tomoyuki Torii; Keiichi Ishiyama; Toshiharu Aoyagi, all of Tokyo, Japan

[73] Assignee: Seiko Instruments Inc., Tokyo, Japan

[21] Appl. No.: 59,732

[22] Filed: Jun. 8, 1987

[30] Foreign Application Priority Data

Jun. 10, 1986 [JP] Japan .................. 61-135439

[51] Int. Cl.$^4$ .................. G01D 9/42; H04N 1/46
[52] U.S. Cl. .................. 346/108; 346/110 R; 358/75; 358/78
[58] Field of Search .................. 346/76 L, 107 R, 108, 346/160, 110 VP, 110 R; 358/75, 78, 300, 302

[56] References Cited

U.S. PATENT DOCUMENTS

| | | | |
|---|---|---|---|
| 3,351,948 | 11/1967 | Bonn .................. | 346/76 L |
| 4,399,209 | 8/1983 | Sanders et al. . | |
| 4,438,453 | 5/1984 | Alston .................. | 358/75 |
| 4,440,846 | 4/1984 | Sanders et al. . | |
| 4,446,479 | 5/1984 | Kurtz .................. | 358/75 |

FOREIGN PATENT DOCUMENTS 2113860 11/1985 United Kingdom .

*Primary Examiner*—E. A. Goldberg
*Assistant Examiner*—Mark Reinhart
*Attorney, Agent, or Firm*—Bruce L. Adams; Van C. Wilks

[57] ABSTRACT

Apparatus is provided for use in printing systems wherein regions of rupturable capsule layer are ruptured to release dye that prints an image on an image-receiving sheet. An optical valve member is positioned between a light source and an imaging sheet which has the layer of capsules on its surface. An image pattern formed on a ferroelectric ceramic plate of the optical valve member by the irradiation of an electron beam together with an ultraviolet light in accordance with each color separation signal is projected onto the imaging sheet. The imaging sheet projected with the image is positioned so that the layer of capsules lies between the imaging sheet and the image-receiving sheet. A pressure roller applies pressure against the imaging sheet and the image-receiving sheet to rupture the capsules between them to thereby transfer the dye to the image-receiving sheet.

8 Claims, 4 Drawing Sheets

CAPSULE RUPTURE PRINTING SYSTEM

BACKGROUND OF THE INVENTION

1. Field of the Invention

This invention relates to a color printing system wherein regions of rupturable capsule layer are ruptured to release a dye that prints a color image on an image-receiving sheet, and more particularly the invention is directed to a color printing system which projects the plural monochrome pictures corresponding to the pictures separated into three primary colors onto the imaging sheet, and presses the sheets to transfer the dye from the imaging sheet to the image-receiving sheet.

2. Description of the Prior Art

For the purpose of hard-copying color pictures projected on a display screen of a CAD/CAM system, a thermo-transferring printer or an ink jet printer is used. However, there are some problems, it takes a long time to print out, and only one color can be presented per dot so that the area of one picture element is large, and therefore, pictures are roughly printed.

In order to solve the above problems, another approach, shown in U.S. Pat. No. 4,399,209 has been proposed. The color imaging system has images formed by image-wise exposing a layer containing a dye and a photosensitive composition encapsulated in a layer of pressure rupturable microcapsules.

The above imaging system attains to present picture elements having the same sizes as those of the microcapsules. Therefore, color pictures can be printed with extremely high resolution.

However, since the imaging system requires surface scanning by use of three kinds of beams having mutually different energy ranges for printing a color picture, the optical system of scanning is complicated and it takes a long time to print one image.

SUMMARY OF THE INVENTION

An object of the present invention is to provide a novel color printer which is affordable and does not require expensive and sophisticated machinery for exposure and processing.

Another object of the present invention is to provide a novel color printer which can increase the speed of printing by making it unnecessary to scan energy beams relative to an imaging sheet which has a layer containing a dye and a photosensitive composition encapsulated in microcapsules.

The above and other related objects and features of the invention will be apparent from the following description of the disclosure in conjunction with the accompanying drawings and the novelty thereof is pointed out in the appended claims.

DESCRIPTION OF THE PREFERRED EMBODIMENTS

Figure 8:
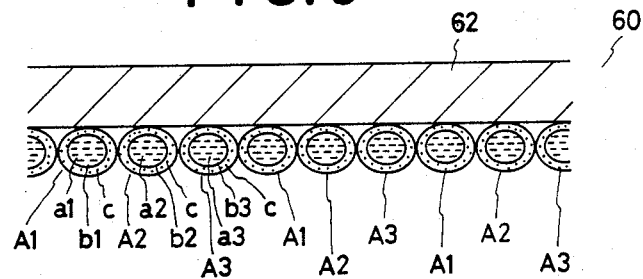
FIG. 8 is a sectional view showing an example of an imaging sheet used in the present invention.
Figure 10:
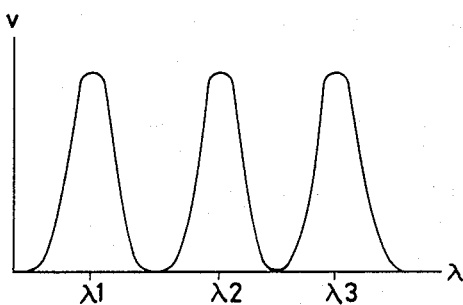
FIG. 10 is an explanatory view showing a sensitivity spectra of the imaging sheet.

First, the principle of the present invention is explained:

FIG. 8 shows a simplified structure of the imaging sheet used in this invention. Reference symbols $A_1$, $A_2$, $A_3$ denote microcapsules presenting colors of cyan, magenta and yellow, respectively. Dye materials or color precursors $a_1$, $a_2$, $a_3$ which generate cyan, magenta and yellow color tones, respectively, and photosensitive compositions $b_1$, $b_2$, $b_3$ which immobilize the dye materials by changing the viscosity etc. as a result of reaction to electromagnetic or light beams of which wave-lengths $\lambda_1$, $\lambda_2$, $\lambda_3$ to the colors of the dye materials (see FIG. 10), are microcapsulated by surrounding thin films C made of gelatin etc. The microcapsules are coated evenly on the surface of the sheet 62 forming carrier so as to constitute an imaging sheet 60.

Figure 9:
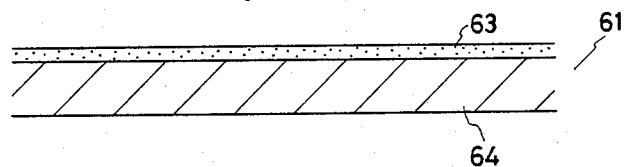
FIG. 9 is a sectional view showing an example of an image-receiving sheet used in the present invention.

FIG. 9 shows an image-receiving sheet 61 to be used with the imaging sheet 60. It is constituted by coating a developing material 63, which generates colors in response to the dye materials $a_1$, $a_2$, $a_3$ on the surface of a sheet 64 forming carrier.

When the above mentioned imaging sheet 60 is exposed to the light having the wave-lengths to which the reactive composites $b_1$, $b_2$, $b_3$ within the microcapsules $A_1$, $A_2$, $A_3$ react, the viscosity of the photosensitive compositions $b_1$, $b_2$, $b_3$ changes. Then, the imaging sheet 60, thus exposed, is united with the image-receiving sheet 61 into one body and pressure is added to the united body so that the capsules $A_1$, $A_2$, $A_3$ are broken. As a result, there comes out a difference in the amount of the dye materials flown out of the capsules between the capsules exposed to light and those unexposed. Consequently, colors corresponding to the wave lengths $\lambda_1$, $\lambda_2$, $\lambda_3$ of the projecting light are developed on the image-receiving sheet 61. That is, color image patterns in accordance with the patterns presented at the time of light projection can be obtained.

Figure 1:
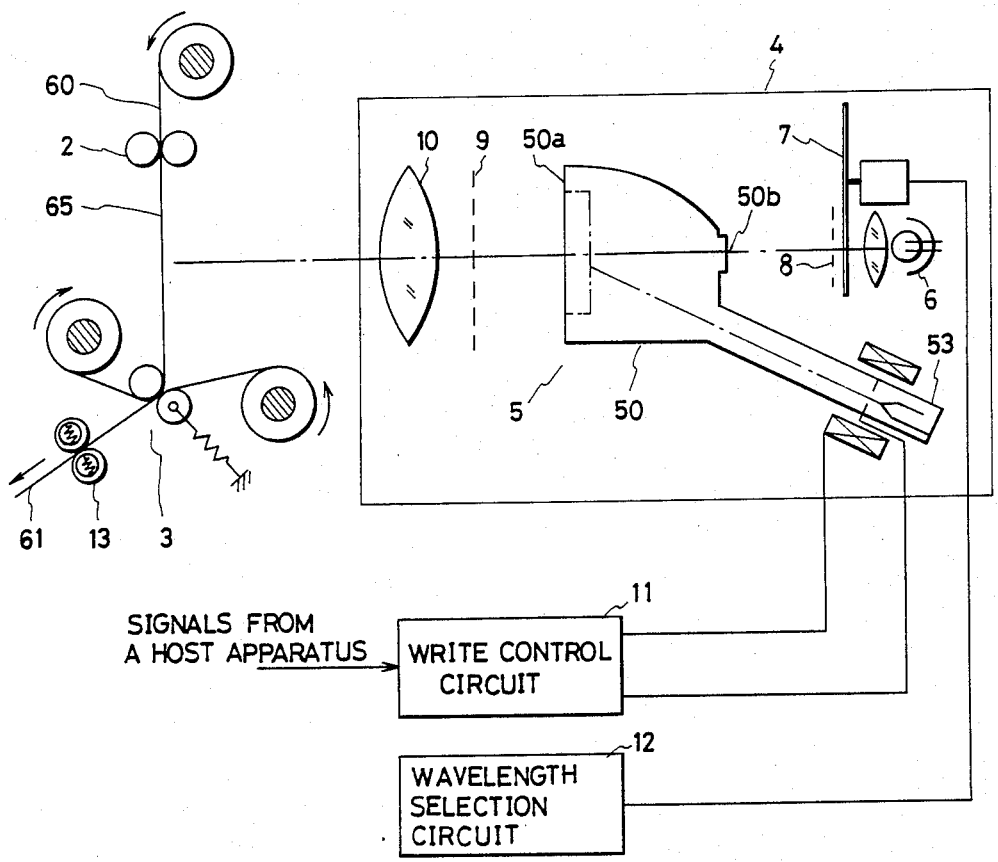
FIG. 1 is a structural view of an apparatus in accordance with one embodiment of the present invention.

FIG. 1 shows one embodiment of the present invention. In the drawing, numeral 60 represents the imaging sheet described already. The imaging sheet 60 is stretched between guide rollers 2 and developing rollers 3 with its microcapsules being disposed on the side of a projection lens 10 in such a manner as to define a light reception region 65, and is compressed by the developing rollers 3 integrally with the image-receiving sheet 61.

Figure 2:
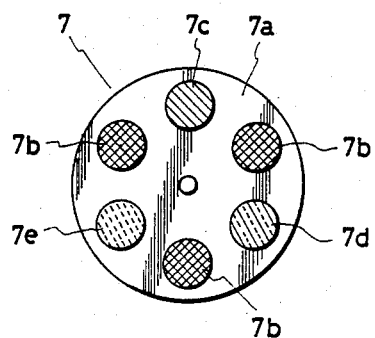
FIG. 2 is a plan view of an example of filters shown in FIG. 1.

Reference numeral 4 represents an image projector, which comprises a light source 6 which is disposed on the incidence side of a projection tube 5 and contains spectra or light component of the wavelengths $\lambda_1$, $\lambda_2$, $\lambda_3$ to which the microcapsules $A_1$, $A_2$, $A_3$ are sensitive and a spectrum of a write excitation wavelength $\lambda_4$, a bandpass filter plate 7 produced by fitting filter materials 7c, 7d and 7e for the wavelengths $\lambda_1$, $\lambda_2$, $\lambda_3$ to windows bored on a disc 7a in such a manner as to interpose three filter materials 7b, 7b, 7b for passing the wavelength $\lambda_4$ between them as shown in FIG. 2, a polarizer 8 disposed on the incidence side of the projection tube 5 together with the bandpass filter plate 7, and an analyzer 9 and a projection lens 10 that are disposed on the projection side.

Figure 3:
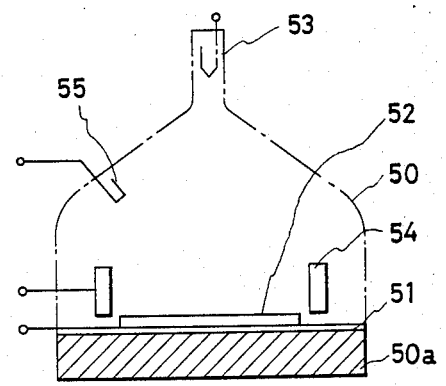
FIG. 3 is a sectional view of a projection tube shown in FIG. 1.

Reference numeral 5 represents the projection tube described above, which has the following construction. Namely, windows 50a, 50b made of a light transmitting material are formed on the front and rear surfaces of a vacuum container 50, into which hydrogen, helium, argon or mixture of argon and nitrogen is sealed. A light transmitting electrode layer 51 is formed on the front window 50a as a face plate as shown in FIG. 3, where an image recording layer 52 made of a transparent ferroelectric ceramics such as PLZT whose birefrigence changes in proportion to a field intensity is formed. An electron gun 53 for scanning the surface of this image recording layer 52 by an electron beam is disposed inside the vacuum container 50.

Turning back again to FIG. 1, reference numeral 11 represents a write control circuit, which controls the scanning position of the electron beam and its intensity on the basis of color separation signals from a host apparatus. Reference numeral 12 represents a wavelength selection circuit, which selects one of the filter materials 7c through 7e in accordance with the color separation signal at the time of exposure. Reference numeral 13 represents heat rollers, 54 denotes a collector ring disposed around the outer periphery of the image recording layer and 55 denotes an electron gun for supplying electrons for erasures.

In this embodiment, when a color separation signal such as a cyan color separation signal is inputted while the wavelength selection circuit 12 selects the filter material 7b and near UV rays having wave length $\lambda_4$ are radiated to the image recording layer 52, the image recording layer 52 is scanned by the electron beam which is modulated by the color separation signal and a charge pattern is written into the image recording layer 52 by a charge density corresponding to the color separation signal. Thus, the recording layer 52 has birefringence corresponding to the color separation signal. During this write operation, the near UV having the wavelength $\lambda_4$ is irradiated to the imaging sheet 60 from the light source 6, but the capsules $A_1$, $A_2$, $A_3$ are not actuated because they do not have sensitivity to this wavelength region.

After the write operation to the image recording layer 52 is completed in the manner described above, the wavelength selection circuit 12 changes the filter 7 to irradiate the rays of light having the cyan sensitive wavelength $\lambda_1$ of the imaging sheet to the projection tube 5. Optical valve action by the polarizer 8 and the analyzer 9 and the image recording surface 52 at the front and rear of the projection tube 5 is applied to the ray of light of the cyan sensitive wavelength $\lambda_1$, and the ray of light becomes patterned light to be expressed by this primary color. The ray of light leaving the analyzer 9 cures or activate only the microcapsule $A_1$ among the microcapsules $A_1$, $A_2$, $A_3$ of the imaging sheet 60, in a quantity corresponding to the light quantity through the projecting lens 10.

When the exposure of the cyan color is completed, the surface charge of the image recording layer 52 is discharged to the collector ring to return the birefringence to the original state by operating ordinary erasing means in a pattern accumulation tube, such as the erasing electron gun 55. At the state where the erasing operation is completed, the wavelength selection circuit 12 rotates the bandpass rotary filter 7 and executes the write operation by the second primary color according to the Magenta color separation signal, while the near UV is being irradiated to the image recording layer 52. After the write operation is completed, the wavelength selection circuit 12 selects the filter material 7d in order to irradiate the ray of light of the Magenta sensitive wavelength $\lambda_2$ to the projection tube 5. Accordingly, the imaging sheet 60 receives the projection of the pattern written into the image recording layer 52 in superposition with the image pattern that has been projected previously.

After pattern projection of the second primary color is completed, the pattern of the third primary color is projected in the same way as described above.

When the latent images of the three primayy colors are formed on the imaging sheet 60 in the manner described above, a pressure is applied to the imaging sheet 60 by the developing rollers 3 while it is being superposed with the image-receiving sheet 61.

In this instance, the photosensitive compositions $b_1$, $b_2$, $b_3$ sealed in the respective microcapsules $A_1$, $A_2$, $A_3$ are cured to extents corresponding to the exposure quantity and for this reason, the amounts of the dye flowing out from the microcapsules $A_1$, $A_2$, $A_3$ are different in accordance with the exposure quantity. Therefore, the dyes $a_1$, $a_2$, $a_3$ ooze out to the image-receiving sheet 61 in the respective amounts corresponding to the exposure quantity from the portions of the imaging sheet 60 which are compressed by the developing rollers 3.

After leaving the developing rollers 3, the imaging sheet 60 is taken up by a take-up roller and heated by the heat roller 13 so that the reaction between the dyes $a_1$, $a_2$, $a_3$ oozing out from the imaging sheet 60 and the developing material 63 is promoted to exhibit colors corresponding to the image signals and to develop the color pattern corresponding to the input image signals. Needless to say, since a large number of microcapsules $A_1$, $A_2$, $A_3$ exhibiting the three primary colors are coated on the surface of the supporting sheet 62, the reproduced color image is expressed as the aggregate of very small three primary colors and the color appears while the primary colors are mixed with one another.

Figure 4:
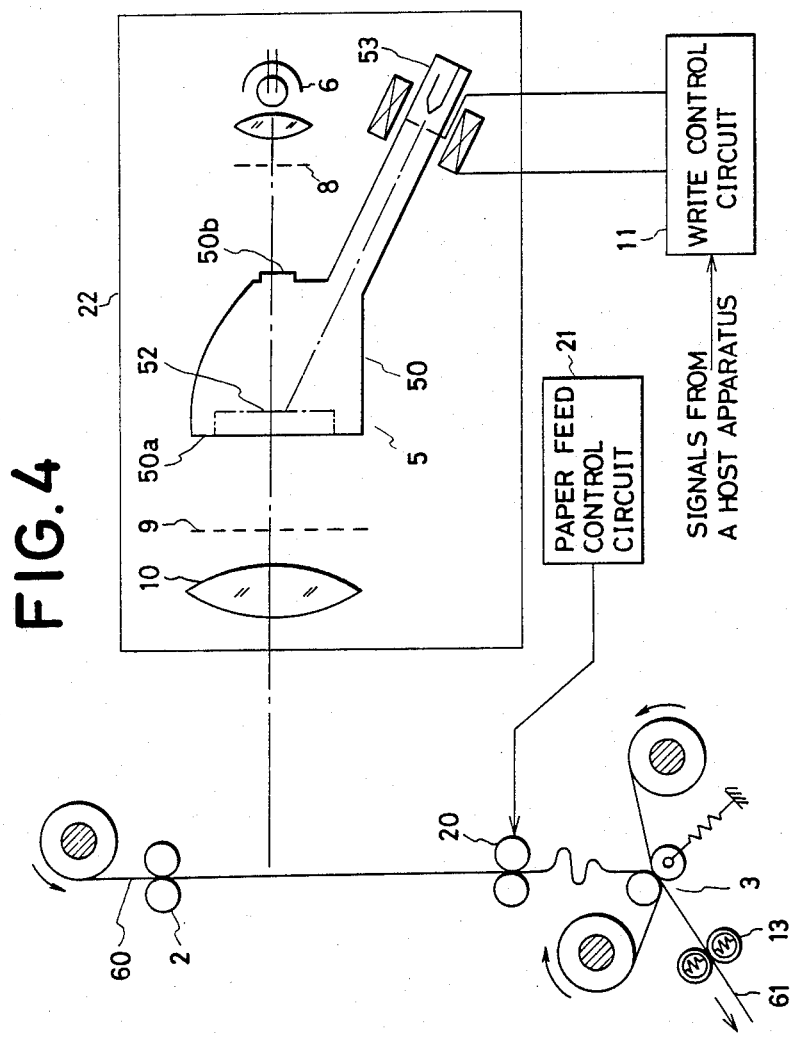
FIG. 4 is a structural view showing another embodiment of the present invention.
Figure 5A:
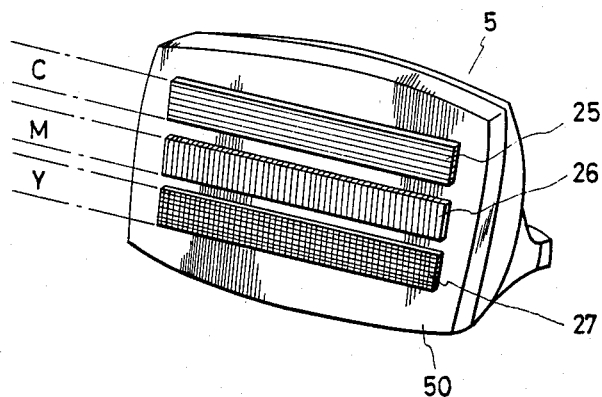
FIGS. 5A and 5B are perspective and sectional views showing the arrangement of filter materials shown in FIG. 4.
Figure 5B:
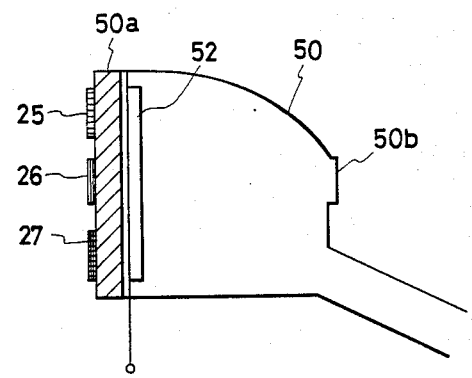

FIG. 4 shows the second embodiment of the present invention. In the drawing, reference numeral 20 represents drive rollers for conveying the imaging sheet 60, which moves the image sheet in registration with the projected image by the signals from a paper feed control circuit 21. Reference numeral 22 represents an image projector having the following construction. Namely, a light source for producing chromatic light including the wavelengths $\lambda_1$, $\lambda_2$, $\lambda_3$, to which the imaging sheet 60 is sensitive, and ultraviolet light of the write excitation wavelength $\lambda_4$ and a polarizer 8 are on the incidence side of the aforementioned projection tube 5, while an analyzer 9 and a projection lens 10 are disposed on the projection side. The main scanning direction is divided into three regions C, M and Y on the front surface of the projection tube 5 as shown in FIG. 5 and filter materials 25, 26 and 27 that permit the passage of the wavelengths $\lambda_1$, $\lambda_2$, $\lambda_3$, to which the microcapsules $A_1$, $A_2$, $A_3$ are sensitive, are disposed in each of these regions.

In this embodiment, the write operation by the cyan color separation signal is made to the first region C, which is in charge of this color and disposed upstream in the conveying direction of the imaging sheet 60, while the wavelengths $\lambda_1$, $\lambda_2$, $\lambda_3$ and the write excitation wavelength $\lambda_4$ are being irradiated to the image recording portion 52 of the projection tube 5 by operating the light source 6. The rays of light incident to the first region C of the image recording portion 52 emit all the spectra $\lambda_1$, $\lambda_2$, $\lambda_3$ corresponding to the pattern that is thus written. Among these spectra, only the component of the wavelength $\lambda_1$ passes through the filter material 25 and irradiates the first region I of the imaging sheet 60, that is, the region corresponding to the region C of the projection tube 5, thereby forming the latent image of the cyan pattern.

Figure 6A:
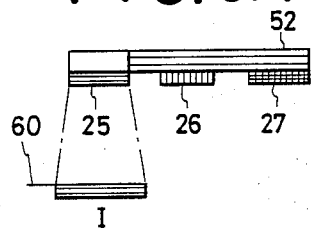
FIGS. 6A–6D are explanatory views showing the operation of the apparatus shown in FIG. 4.

On the other hand, no charge on the basis of the color separation signals is supplied to the regions M and Y of the image recording portion 52. Therefore, the rays of light incident to these regions are blocked by the image recording portion 52, the polarizer 8 and the analyzer 9 and cannot irridiate the imaging sheet 60 (see FIG. 6A).

Figure 6B:
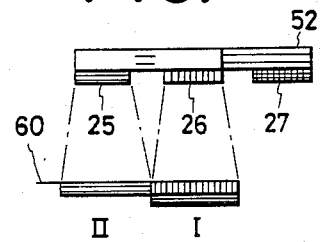

After the write operation of the first region I is thus completed, the paper feed control circuit 21 moves the imaging sheet 60 by the width of the image corresponding to the first region I downstream in the conveying direction in such a manner that the unexposed portion of the imaging sheet 60 faces the region C of the projection tube 5. After the charge on the surface of the image recording portion 52 is returned to the original state to erase the charge pattern, the write control circuit writes the cyan color separation signal corresponding to the next pattern to the region C and the Magenta color separation signal M to the region M of the image recording portion 52. As the write operation proceeds, the cyan pattern corresponding to a new image formation region II is projected from the region C of the projection tube 5 and the pattern of the region M of the projection tube 5 in super position with the region I that has been exposed previously, from the region M of the projection tube 5. Needless to say, projection of light is not effected to the region Y of the projection tube 5 because no image is written (see FIG. 6B).

Figure 6C:
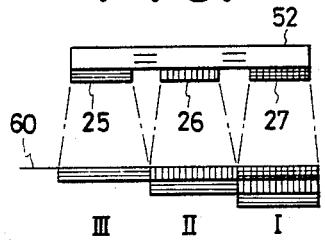
Figure 6D:
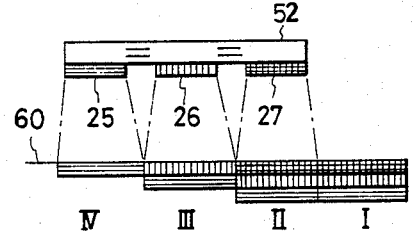

After the second exposure operation is completed, the paper feed control circuit 21 conveys the image sheet by the width of the image corresponding to the region I in such a manner that the unexposed portion faces the region C. After the pattern of the image recording portion 52 is erased and returned to the original state, the write control circuit 11 writes the cyan color separation signal corresponding to the next pattern to the region C of the Projection tube 5, the Magenta color separation signal to the region M and the yellow color separation signal to the region Y. Therefore, the cyan pattern is projected to the new image region from the region C of the projection tube 5, the Magenta pattern from the region M in superposition with the region II that has been formed previously, and the yellow latent image from the region Y to the region I in which the cyan and Magenta latent image has already been formed. Accordingly, the region I of the imaging sheet 60 receives exposure of the three primary colors, and the latent image corresponding to the original is formed (FIG. 6C). Therefore, the color separation signals are written and projected in the same way while the projection area of the imaging sheet 60 is deviated (FIG. 6D).

The portion where the latent image of the three primary color pattern has been formed are sent to the developing rollers 3 and compressed while being superposed with the image-receiving sheet 61, thereby exhibiting the color pattern corresponding to the color separation signals. Incidentally, at the final end portion of the image to be printed, the write operation is stopped in the sequence of the regions C, M and Y, and the printing region as a whole receives the exposure of three primary colors.

Although the embodiment described above divides the projection surface of the projection tube into three segments, it is possible to divide the projection area into 3N (N=natural number) regions and to dispose the filter material passing only the ray of light of a wave length to which the microcapsule is sensitive, in each region. In this case, the same action can be brought forth as in the embodiment described above.

Figure 7:
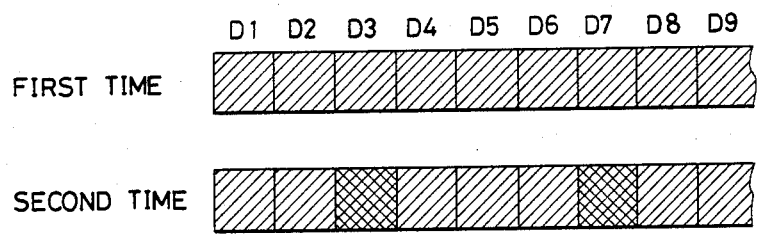
FIG. 7 is an explanatory view showing another example of the write operation.

In the embodiments described above, the written pattern is immediately projected after scanning of the image recording portion. However, birefringence of the image recording portion can be made great by making the scanning operation a plurality of times for high image density portions $D_3$, $D_7$ ... by the color separation signals as shown in FIG. 7, in order to improve tone wedge and contrast of the printed image.

In the embodiments described above, the microcapsules are ruptured by applying the pressure to the imaging sheet, but the same action can be obtained by bringing an oscillation plate having a ultrasonic oscillator into contact with the microcapsules by elastic oscillation or to thermally rupture them by use of microwave or heat rays.

Furthermore, in the embodiments described above, the microcapsules and the developer are coated on the separate supports, but the same action can be obtained obviously by use of a sheet on which both the microcapsules and the developer are coated.

As described above, the present invention forms an image pattern on an optical valve member by an electron beam in accordance with each color separation signal and projects this image pattern to an imaging sheet by use of rays of light having a different wavelength. Accordingly, the present invention provides the following effects.

(1) The scanning speed can be improved at the time of conversion from the color separation signal to the image and the write time can be reduced by reducing the scanning area so that the printing speed can be improved.

(2) Since exposure of the image information to the image sheet is made by projection, positioning of the primary color informations can be simplified and a printing size can be changed easily.

What is claimed is:

1. An apparatus for forming an image on an image-receiving sheet, comprising:
    an imaging sheet coated with rupturable color precursor-containing capsules;
    means for moving said imaging sheet past a light receiving station;
    light source means for selectively irradiating light rays of different wavelengths corresponding to at least three primary colors and ultraviolet rays;
    a wavelength selection circuit for selecting one wavelength from said plurality of wavelengths by controlling said light source means;

latent image forming means having a window through which light rays emitted from said light source means pass, a transparent ferroelectric ceramic member provided therein on the opposing side of said window, an electron gun for irradiating an electron beam onto said transparent ferroelectric ceramic member while being irradiated with said ultraviolet light for forming a latent image corresponding to image information on said transparent ferroelectric ceramic member by changing the birefringence of said transparent ferroelectric ceramic member, said latent image being projected to said light receiving station upon receiving incident light rays passed through said window, and a gas such as hydrogen, helium, argon and a mixture of argon and nitrogen contained therein;

a write control circuit for driving said electron gun in response to the image information; and coloring means for coloring said image-receiving sheet by rupturing said color precursor-containing capsules and transferring the color precursor to said image-receiving sheet.

2. Apparatus for forming an image on an image-receiving sheet, comprising:

an imaging sheet coated with rupturable color containing capsules;

light source means for irradiating light rays having different wavelengths corresponding to at least three primary colors and ultraviolet rays;

latent image forming means having a window through which light rays emitted from said light source means pass, a transparent ferroelectric ceramic member provided therein on the opposing side of said window, an electron gun for irradiating an electron beam onto said transparent ferroelectric ceramic member for forming latent images corresponding to image information on said transparent ferroelectric ceramic member by changing the birefringence of said transparent ferroelectric ceramic member, said latent images being projected to a receiving station upon receiving incident light rays passed through said window, and a gas such as hydrogen, helium, argon and a mixture of argon and nitrogen contained therein;

filters provided adjacent to each other on the projection side of said transparent ferroelectric ceramic member for passing light rays corresponding to cyan, magenta and yellow color tones;

a write control circuit for driving said electron beam in response to color separation signals of image information;

means for shifting step-wise said imaging sheet past said light receiving station by the width of an exposed image corresponding to one of said filters; and coloring means for coloring said image-receiving sheet by rupturing said color precursor-containing capsules and transferring the color precursor to said image-receiving sheet.

3. An apparatus for projecting an image pattern with a light component of a specific wavelength onto an image sheet coated with rupturable microcapsules to selectively activate the same according to the projected image pattern to thereby form a latent image on the image sheet, the apparatus comprising: a light source opposed to the image sheet for selectively producing chromatic light containing light components of different wavelengths and ultraviolet light; projecting means interposed between the image sheet and the light source for projecting an image pattern onto the image sheet, the projecting means including an optical laser receptive of light from the light source and composed of ferroelectric ceramic having variable birefringence, and electron-beam irradiating means operative while the optical layer is selectively exposed to the ultraviolet light for irradiating the optical layer with an electron beam to selectively vary the birefringence thereof to form an image pattern thereon; and filtering means interposed between the image sheet and the light source for filtering the chromatic light to selectively pass a light component having a specific wavelength to enable the projecting means to project the image pattern with the selected light component to thereby activate the microcapsules.

4. An apparatus according to claim 3; wherein the electron beam irradiating means includes means for sequentially forming three different image patterns on the optical layer corresponding to the three primary color tones; and filtering means includes multi-filtering means for sequentially filtering the chromatic light to sequentially pass three different light components having specific wavelengths corresponding to the three primary color tones effective to selectively activate respective ones of three different kinds of rupturable microcapsules coated on the image sheet to thereby enable the projecting means to form a latent composite color image on the image sheet.

5. An apparatus according to claim 4; wherein the multi-filtering means comprises a rotary filter member having three different filter sections effective to pass respective ones of the specific light components and being interposed between the light source and the projecting means.

6. An apparatus according to claim 4; wherein the optical layer has three separate sections in wich respective ones of the three different image patterns are formed; and the multi-filtering means comprises three separate filter members disposed on the respective three sections of the optical layer and effective to pass respective ones of the specific light components.

7. An apparatus according to claim 3; including control means for controlling the irradiating means to scan the electron beam according to image information representative of a desired image pattern to form the desired image pattern on the optical layer.

8. An apparatus according to claim 3; including means for pressing the image sheet formed with the latent image against a print medium to selectively rupture the activated microcapsules to thereby develop a visible image on the print medium.

* * * * *